(12) United States Patent
Chuang et al.

(10) Patent No.: US 12,663,715 B2
(45) Date of Patent: Jun. 23, 2026

(54) PHOTOSENSITIVE RESIN FILM AND APPLICATION THEREOF

(71) Applicant: CHANG CHUN PLASTICS CO., LTD., Taipei City (TW)

(72) Inventors: Zih-I Chuang, Taipei City (TW); Yun-Jung Wu, Taipei City (TW); An-Pang Tu, Taipei City (TW)

(73) Assignee: Chang Chun Plastics Co., Ltd., Taipei City (TW)

( * ) Notice: Subject to any disclaimer, the term of this patent is extended or adjusted under 35 U.S.C. 154(b) by 0 days.

(21) Appl. No.: 18/590,304

(22) Filed: Feb. 28, 2024

(65) Prior Publication Data

US 2025/0224674 A1 Jul. 10, 2025

(30) Foreign Application Priority Data

Jan. 4, 2024 (CN) .......................... 202410010517.2
Jan. 4, 2024 (TW) .................................. 113100428

(51) Int. Cl.
| | |
|---|---|
| *G03F 7/027* | (2006.01) |
| *C08F 220/14* | (2006.01) |
| *C08F 220/18* | (2006.01) |
| *G03F 7/033* | (2006.01) |
| *G03F 7/038* | (2006.01) |
| *G03F 7/11* | (2006.01) |
| *G03F 7/38* | (2006.01) |

(52) U.S. Cl.
CPC ............ *G03F 7/027* (2013.01); *C08F 220/14* (2013.01); *C08F 220/1806* (2020.02); *G03F 7/033* (2013.01); *G03F 7/038* (2013.01); *G03F 7/38* (2013.01)

(58) Field of Classification Search
CPC . G03F 7/027; G03F 7/033; G03F 7/11; G03F 7/38
See application file for complete search history.

(56) References Cited

U.S. PATENT DOCUMENTS

| | | | |
|---|---|---|---|
| 2011/0105638 A1* | 5/2011 | Kawabe | ............... C08F 212/36 |
| | | | 522/182 |
| 2023/0016182 A1* | 1/2023 | Qian | .................... C07D 219/02 |
| 2023/0265227 A1* | 8/2023 | Yamaguchi | ........... C08F 265/06 |
| 2023/0375930 A1 | 11/2023 | Kunimatsu et al. | |

FOREIGN PATENT DOCUMENTS

| | | |
|---|---|---|
| CN | 1996144 A | 7/2007 |
| JP | 2020-56790 A | 4/2020 |
| KR | 10-2023-0033718 A | 3/2023 |
| TW | 202334260 A | 9/2023 |
| WO | WO 2018/117047 A1 | 8/2019 |
| WO | WO 2021/161965 A1 | 8/2021 |
| WO | WO 2021/172455 A1 | 9/2021 |

* cited by examiner

*Primary Examiner* — John S. Chu

(74) *Attorney, Agent, or Firm* — Christensen, Fonder, Dardi & Busse PLLC; John P. Fonder

(57) ABSTRACT

A photosensitive resin film and application thereof are provided. When the photosensitive resin film is subjected to a thermogravimetric analysis under the conditions of heating at a rate of 5° C./min from 40° C. to 200° C. and then keeping the temperature at 200° C. for 10 min, the absolute value of the first derivative of the weight percentage with respect to time within the range of 0 to 40 min is higher than 0.1%/min and not higher than 1.0%/min.

15 Claims, No Drawings

PHOTOSENSITIVE RESIN FILM AND APPLICATION THEREOF

CLAIM FOR PRIORITY

This application claims the benefits of Taiwan Patent Application No. 113100428 filed on Jan. 4, 2024 and China Patent Application No. 202410010517.2 filed on Jan. 4, 2024, the subject matters of which are incorporated herein in their entirety by reference.

BACKGROUND OF THE INVENTION

Field of the Invention

The present application provides a photosensitive resin film, particularly a high-thickness photosensitive resin film, and application of the photosensitive resin film.

Descriptions of the Related Art

Photosensitive resin films are films that undergo chemical changes after exposure to light and find applications as photoresist films in various electronic fields. Depending on the changes after light exposure, photoresist films can be categorized into positive and negative photoresist films. In positive photoresist films, the parts exposed to light dissolve during development, leaving behind the unexposed parts. In negative photoresist films, the parts not exposed to light dissolve during development, leaving behind the parts exposed to light.

In the printed circuit boards (PCBs) industry, photoresist films are utilized in the etching or electroplating procedures to create circuit patterns. Due to the increasing complexity and size of electronic components, a thick photoresist film with a high depth-to-width ratio is required in the printed circuit boards industry. However, conventional photoresist films often exhibit poor storage properties, adhesion and/or operability, leading to defects in subsequent electroplating or etching processes.

SUMMARY OF THE INVENTION

Given the aforementioned technical problems, the present application aims to provide a photosensitive resin film with excellent storage properties, adhesion and operability. This film can be used in various electronic fields that demand high-precision etching or electroplating processes.

Therefore, an objective of the present application is to provide a photosensitive resin film, wherein when the photosensitive resin film is subjected to a thermogravimetric analysis under the conditions of heating at a rate of 5° C./min from 40° C. to 200° C. and then keeping the temperature at 200° C. for 10 min, the absolute value of the first derivative of the weight percentage with respect to time within the range of 0 to 40 min is higher than 0.1%/min and not higher than 1.0%/min.

In some embodiments of the present application, when the photosensitive resin film is subjected to the thermogravimetric analysis, a weight loss percentage of the photosensitive resin film within the range of 0 to 20 min is higher than 0 wt % and not higher than 10 wt %, preferably ranging from 2 wt % to 10 wt %.

In some embodiments of the present application, the photosensitive resin film has a thickness of 60 µm to 600 µm.

In some embodiments of the present application, the photosensitive resin film is a dry film. For example, the photosensitive resin film can be a dry film comprising 0.1 wt % to 8 wt % of a solvent based on the total weight of the photosensitive resin film.

In some embodiments of the present application, the photosensitive resin film has a $T_{d5}$ of 90° C. or higher.

In some embodiments of the present application, the photosensitive resin film has a $T_{d10}$ of 140° C. or higher.

In some embodiments of the present application, the photosensitive resin film comprises: (A) an alkali-soluble polymer, (B) a component of ethylenically unsaturated compound(s), and (C) a photopolymerization initiator.

In some embodiments of the present application, the component (B) of ethylenically unsaturated compound(s) comprises one or more bifunctional acrylate-based compounds.

In some embodiments of the present application, based on the weight of the component (B) of ethylenically unsaturated compound(s), the amount of the bifunctional acrylate-based compounds is 60 wt % or more.

Another objective of the present application is to provide a composite film, which comprises the aforementioned photosensitive resin film and a protective film on at least one surface of the photosensitive resin film.

In some embodiments of the present application, the protective film is selected from the group consisting of a polyethylene terephthalate film, a polyolefin film, and a composite thereof.

To render the above objectives, technical features, and advantages of the present application more apparent, the present application will be described in detail with reference to some specific embodiments hereinafter.

BRIEF DESCRIPTION OF THE DRAWINGS

Not applicable.

DESCRIPTION OF THE EMBODIMENTS

Some specific embodiments of the present application will be described in detail. However, the present application may be embodied in various embodiments and should not be limited to the embodiments described in the specification.

Unless additionally explained, the expressions "a," "the," or the like, as recited in the specification and the claims, should include both the singular and plural forms.

Unless additionally explained, the expressions "first," "second," or the like, as recited in the specification and the claims, are used solely to distinguish the illustrated elements or components without special meanings. These expressions are not used to represent any priority.

Unless additionally explained, the term "(meth)acrylic," "(meth)acrylate," or the like, is intended to cover both species containing and not containing the group in the parentheses. For example, "(meth)acrylic acid" intends to cover both acrylic acid and methacrylic acid, and "methyl (meth)acrylate" intends to cover both methyl acrylate and methyl methacrylate.

In the specification and the claims, the weight average molecular weight (Mw) is measured by gel permeation chromatography (GPC) and calculated by comparing it with a polystyrene standard sample. The unit of the weight average molecular weight (Mw) is "g/mol".

The primary advantage of the present application over prior art lies in providing a high-thickness photosensitive resin film with excellent storage properties, adhesion and operability by controlling the first derivative of the weight percentage with respect to time in a thermogravimetric analysis. Details regarding the photosensitive resin film of the present application and its applications are provided below.

1. Photosensitive Resin Film

The photosensitive resin film of the present application can be a positive photoresist film or a negative photoresist film. In some embodiments of the present application, the photosensitive resin film is a negative photoresist film. That is, after light exposure of the photosensitive resin film, the parts that were not exposed to light will be dissolved away in the development process, leaving behind the parts exposed to light.

As will be discussed in the following sections, before the use of a photosensitive resin film, it is common to provide a protective film that provides protection and support functions on a surface of the photosensitive resin film to form a structure of a composite film, to facilitate the storage of the photosensitive resin film and to protect the photosensitive resin film from contamination or damage. Unless additionally explained, the "thickness" and "thermogravimetric properties" recited in the specification and claims are described with respect to the photosensitive resin film itself and do not include other parts such as a protective film that is used in combination with the photosensitive resin film.

In some embodiments of the present application, the photosensitive resin film is a dry film, that is, a photosensitive resin film with low solvent content. The aforementioned low solvent content means that the amount of solvent based on the total weight of the photosensitive resin film is 0.1 wt % to 8 wt %, more specifically 0.1 wt % to 7 wt %. Compared with ink-like or liquid wet films, dry films are less likely to flow or deform due to their low solvent content, and can be attached to a substrate without additional process such as coating, drying, or the like. Therefore, dry films are easy to control and have good operability.

The photosensitive resin film of the present application can have a high thickness. Specifically, the photosensitive resin film of the present application can have a thickness of 60 μm to 600 μm. For example, the thickness of the photosensitive resin film of the present application can be 60 μm, 70 μm, 80 μm, 90 μm, 100 μm, 110 μm, 120 μm, 130 μm, 140 μm, 150 μm, 160 μm, 170 μm, 180 μm, 190 μm, 200 μm, 210 μm, 220 μm, 230 μm, 240 μm, 250 μm, 260 μm, 270 m, 280 μm, 290 μm, 300 μm, 310 μm, 320 μm, 330 μm, 340 μm, 350 μm, 360 μm, 370 μm, 380 m, 390 μm, 400 μm, 410 μm, 420 μm, 430 μm, 440 μm, 450 μm, 460 μm, 470 μm, 480 μm, 490 m, 500 μm, 510 μm, 520 μm, 530 μm, 540 μm, 550 μm, 560 μm, 570 μm, 580 μm, 590 μm, or 600 μm, or within a range between any two of the values described herein. As the thickness of the photosensitive resin film increases, the achievable thickness for plating a metal conductive layer also increases when the photosensitive resin film is used as a photoresist film. Therefore, the photosensitive resin film is particularly suitable for 2.5D and 3D integrated circuit packaging and is useful in the patterning prior to the plating of the conductive layer.

The photosensitive resin film of the present application can be formed by a single photosensitive resin layer, or by stacking two or more photosensitive resin layers. For example, the photosensitive resin film of the present application can be formed by stacking two, three or four photosensitive resin layers, but the present application is not limited thereto.

1.1. Thermogravimetric Properties of Photosensitive Resin Film

The photosensitive resin film of the present application has specific thermogravimetric properties. Specifically, when the photosensitive resin film is subjected to a thermogravimetric analysis under the conditions of heating at a rate of 5° C./min from 40° C. (i.e., the temperature at the $0^{th}$ second) to 200° C. and then maintaining the temperature at 200° C. for 10 min, the absolute value of the first derivative of the weight percentage with respect to time (i.e., d(wt %)/dt) within the range of 0 to 40 min is higher than 0.1%/min and not higher than 1.0%/min, preferably ranging from 0.2%/min to 1.0%/min. For example, when the photosensitive resin film is subjected to a thermogravimetric analysis under the aforementioned conditions, the absolute value of the first derivative of the weight percentage with respect to time within the range of 0 to 40 min can be 0.11%/min, 0.13%/min, 0.15%/min, 0.17%/min, 0.19%/min, 0.21%/min, 0.23%/min, 0.25%/min, 0.27%/min, 0.29%/min, 0.31%/min, 0.33%/min, 0.35%/min, 0.37%/min, 0.39%/min, 0.41%/min, 0.43%/min, 0.45%/min, 0.47%/min, 0.49%/min, 0.51%/min, 0.53%/min, 0.55%/min, 0.57%/min, 0.59%/min, 0.61%/min, 0.63%/min, 0.65%/min, 0.67%/min, 0.69%/min, 0.71%/min, 0.73%/min, 0.75%/min, 0.77%/min, 0.79%/min, 0.81%/min, 0.83%/min, 0.85%/min, 0.87%/min, 0.89%/min, 0.91%/min, 0.93%/min, 0.95%/min, 0.97%/min, 0.99%/min, or 1.0%/min, or within a range between any two of the values described herein.

The expression "the absolute value of the first derivative of the weight percentage with respect to time within the range of 0 to 40 min is higher than 0.1%/min and not higher than 1.0%/min" means that at every instant within the range of 0 to 40 min, the first derivative of the weight percentage with respect to time is higher than 0.1%/min and not higher than 1.0%/min. Therefore, if the absolute value of the first derivative of the weight percentage with respect to time within the range of 0 to 40 min has a minimum value higher than 0.1%/min and a maximum value not higher than 1.0%/min, it can be confirmed that the photosensitive resin film exhibits the aforementioned thermogravimetric property of the present application. Conversely, if the absolute value of the first derivative of the weight percentage with respect to time within the range of 0 to 40 min has a minimum value not higher than 0.1%/min or a maximum value higher than 1.0%/min, it can be confirmed that the photosensitive resin film does not exhibit the aforementioned thermogravimetric property of the present application.

In the present application, the first derivative of the weight percentage with respect to time is obtained by subjecting the photosensitive resin film to the thermogravimetric analysis and then analyzing a derivative thermogravimetric curve. Specifically, the thermogravimetric analysis is conducted by the following method: removing the protective films from both surfaces of the photosensitive resin film; making two cuts each along the transverse direction (TD) and machine direction (MD) to cut the photosensitive resin film into a sample of 5 mg to 30 mg; heating the furnace of the thermogravimetric analyzer at a heating rate of 5° C./min from room temperature to 40° C. and keeping the temperature at 40° C.; placing the sample in the furnace of the thermogravimetric analyzer, using air at a flow rate of 40 mL/min as a purge gas for the balance and air at a flow rate of 100 mL/min as a purge gas for the sample; heating the sample at a rate of 5° C./min from 40° C. to 200° C. and then keeping the temperature at 200° C. for 10 min, while recording the weight loss every 0.5 second during the process to obtain a thermogravimetric curve of the weight percentage with respect to time within the range of 0 to 40 minutes, calculated from the beginning of heating with a rate of 5° C./min; and calculating the first derivative from the thermogravimetric curve to obtain a derivative thermogravimetric curve. In some embodiments of the present application, a photosensitive resin film cut into 20 mg is used as a sample.

When the photosensitive resin film is subjected to thermogravimetric analysis under the aforementioned conditions, the weight loss percentage of the photosensitive resin film within the range of 0 to 20 min is preferably higher than 0 wt % and not higher than 10 wt %, more preferably ranging from 2 wt % to 10 wt %, and even more preferably ranging from 2.2 wt % to 9.5 wt %. For example, when the photosensitive resin film is subjected to thermogravimetric analysis under the aforementioned conditions, the weight loss percentage of the photosensitive resin film within the range of 0 to 20 min can be 0.5 wt %, 1 wt %, 1.5 wt %, 2 wt %, 2.5 wt %, 3 wt %, 3.5 wt %, 4 wt %, 4.5 wt %, 5 wt %, 5.5 wt %, 6 wt %, 6.5 wt %, 7 wt %, 7.5 wt %, 8 wt %, 8.5 wt %, 9 wt %, 9.5 wt %, or 10 wt %, or within a range between any two of the values described herein. The weight loss percentage of the photosensitive resin film within the range of 0 to 20 min is obtained from the aforementioned thermogravimetric curve.

In some embodiments of the present application, when the photosensitive resin film is subjected to thermogravimetric analysis under the aforementioned conditions, the weight loss percentage of the photosensitive resin film within the range of 0 to 10 min is not higher than 3 wt %. For example, when the photosensitive resin film is subjected to thermogravimetric analysis under the aforementioned conditions, the weight loss percentage of the photosensitive resin film within the range of 0 to 10 min can be 0.5 wt %, 1 wt %, 1.5 wt %, 2 wt %, 2.5 wt %, or 3 wt %, or within a range between any two of the values described herein. The weight loss percentage of the photosensitive resin film within the range of 0 to 10 min is obtained from the aforementioned thermogravimetric curve.

In the thermogravimetric analysis, the temperature at which the weight loss of the photosensitive resin film reaches 3 wt % relative to the initial weight, when placed into the thermogravimetric analyzer, is referred to as "$T_{d3}$". In some embodiments of the present application, the $T_{d3}$ of the photosensitive resin film is preferably 90° C. or higher. For example, the $T_{d3}$ of the photosensitive resin film can be 90° C. or higher, 100° C. or higher, 110° C. or higher, 120° C. or higher, 125° C. or higher, 130° C. or higher, 135° C. or higher, 140° C. or higher, 145° C. or higher, 150° C. or higher, 155° C. or higher, 160° C. or higher, 165° C. or higher, 170° C. or higher, 175° C. or higher, 180° C. or higher, 185° C. or higher, 190° C. or higher, 195° C. or higher, or 200° C. or higher, or within a range between any two of the values described herein.

In the thermogravimetric analysis, the temperature at which the weight loss of the photosensitive resin film reaches 5 wt % relative to the initial weight, when placed into the thermogravimetric analyzer, is referred to as "$T_{d5}$". In some embodiments of the present application, the $T_{d5}$ of the photosensitive resin film is preferably 90° C. or higher, more preferably 105° C. or higher, and even more preferably 115° C. or higher. For example, the $T_{d5}$ of the photosensitive resin film can be 110° C. or higher, 120° C. or higher, 125° C. or higher, 130° C. or higher, 135° C. or higher, 140° C. or higher, 145° C. or higher, 150° C. or higher, 155° C. or higher, 160° C. or higher, 165° C. or higher, 170° C. or higher, 175° C. or higher, 180° C. or higher, 185° C. or higher, 190° C. or higher, 195° C. or higher, or 200° C. or higher, or within a range between any two of the values described herein.

In the thermogravimetric analysis, the temperature at which the weight loss of the photosensitive resin film reaches 10 wt % relative to the initial weight, when placed into the thermogravimetric analyzer, is referred to as "$T_{d10}$". In some embodiments of the present application, the $T_{d10}$ of the photosensitive resin film is preferably 140° C. or higher, more preferably 145° C. or higher. For example, the $T_{d10}$ of the photosensitive resin film can be 145° C. or higher, 150° C. or higher, 155° C. or higher, 160° C. or higher, 165° C. or higher, 170° C. or higher, 175° C. or higher, 180° C. or higher, 185° C. or higher, 190° C. or higher, 195° C. or higher, or 200° C. or higher, or within a range between any two of the values described herein.

The thermogravimetric properties of the photosensitive resin film of the present application can be controlled by, for example, adjusting the components of the photosensitive resin film or the process conditions (such as drying conditions) of the photosensitive resin film. Persons having ordinary skill in the art would be able to prepare a photosensitive resin film with the aforementioned thermogravimetric properties by referring to the specification of the subject application, particularly relying on the specific illustrations in the Examples.

1.2. Components of Photosensitive Resin Film

With the premise that the absolute value of the first derivative of the weight percentage with respect to time within the range of 0 to 40 min is higher than 0.1%/min and not higher than 1.0%/min when the photosensitive resin film is subjected to the thermogravimetric analysis under the aforementioned conditions, the components of the photosensitive resin film can be adjusted depending on the need. In some embodiments of the present application, the photosensitive resin film comprises: (A) an alkali-soluble polymer, (B) a component of ethylenically unsaturated compound(s), and (C) a photopolymerization initiator. The photosensitive resin film can comprise a low amount of solvent and can optionally further comprise an additive.

1.2.1. (A) Alkali-Soluble Polymer

Examples of the alkali-soluble polymer include, but are not limited to, carboxyl-containing polymers such as a carboxyl-containing acrylic acid-based polymer, a carboxyl-containing vinyl aromatic-based polymer, a carboxyl-containing norbornene-based polymer, a carboxyl-containing epoxy-based polymer, a carboxyl-containing amide-based polymer, a carboxyl-containing amide epoxy-based polymer, a carboxyl-containing alkyd-based polymer, and a carboxyl-containing phenol-based polymer. The aforementioned alkali-soluble polymers can be used alone or in combination. In some embodiments of the present application, the alkali-soluble polymer is a carboxyl-containing acrylic acid-based polymer.

The alkali-soluble polymer can be, for example, obtained by polymerizing one or more carboxyl-containing polymerizable monomers, or by copolymerizing one or more carboxyl-containing polymerizable monomers with other polymerizable monomers that do not contain carboxyl. Therefore, the alkali-soluble polymer can comprise one or more repeating units derived from carboxyl-containing polymerizable monomers or comprises one or more repeating units derived from carboxyl-containing polymerizable monomers and one or more repeating units derived from other polymerizable monomers.

In some embodiments of the present application, the alkali-soluble polymer has repeating units derived from at least one first polymerizable monomers and repeating units derived from at least one-second polymerizable monomers, wherein the first polymerizable monomers contain carboxyl. Examples of the first polymerizable monomers include, but are not limited to, (meth)acrylic acid, α-bromo(meth)acrylic acid, α-chloro(meth)acrylic acid, β-phthalimido(meth) acrylic acid, β-styryl(meth)acrylic acid, propiolic acid, fumaric acid, cinnamic acid, crotonic acid, itaconic acid, and maleic acid. The second polymerizable monomers do not contain carboxyl. Examples of the second polymerizable monomers include, but are not limited to, (meth)acrylate-based compounds such as methyl (meth)acrylate, ethyl (meth)acrylate, n-propyl (meth)acrylate, isopropyl (meth) acrylate, n-butyl (meth)acrylate, isobutyl (meth)acrylate, 2-ethylhexyl (meth)acrylate, tert-butyl (meth)acrylate, 2-hydroxyethyl (meth)acrylate, 2-hydroxypropyl (meth)acrylate, cyclohexyl (meth)acrylate, benzyl (meth)acrylate, 1-methyl-cyclopentyl (meth)acrylate, 1-methyl-cyclohexyl (meth) acrylate, 2-methyl-2-adamantyl (meth)acrylate, 2-ethyl-2-adamantyl (meth)acrylate, 2-butyl-2-adamantyl (meth) acrylate, tetrahydrofurfuryl methyl (meth)acrylate, dimethylamino ethyl (meth)acrylate, diethylamino ethyl (meth)acrylate, glycidyl methacrylate, 2,2,2-trifluoroethyl (meth)acrylate, and 2,2,3,3-tetrafluoropropyl (meth)acrylate; (meth)acrylonitrile; vinyl ester-based compounds such as vinyl acetate and vinyl n-butylate; vinyl aromatic-based compounds such as styrene, vinyl naphthalene, 3-acetoxystyrene, 4-acetoxystyrene, vinyl toluene, and α-methyl styrene; norbornene; acrylamide; maleate-based compounds such as monomethyl maleate, monoethyl maleate, and monoisopropyl maleate; and derivatives of the forgoing polymerizable monomers. The aforementioned first polymerizable monomers and second polymerizable monomers can be used alone or in combination.

In a preferred embodiment of the present application, the alkali-soluble polymer is obtained by copolymerizing (meth)acrylic acid and one or more (meth)acrylate-based compounds. Therefore, the alkali-soluble polymer comprises repeating units derived from (meth)acrylic acid and repeating units derived from (meth)acrylate-based compounds. The weight ratio of the (meth)acrylic acid to the (meth)acrylate-based compounds can be 1:20 to 1:1, more specifically 1:6 to 1:4. For example, the weight ratio of the (meth)acrylic acid to the (meth)acrylate-based compound can be 1:20, 1:19, 1:18, 1:17, 1:16, 1:15, 1:14, 1:13, 1:12, 1:11, 1:10, 1:9, 1:8, 1:7, 1:6, 1:5, 1:4, 1:3, 1:2, or 1:1, or within a range between any two of the values described herein.

The weight average molecular weight (Mw) of the alkali-soluble polymer can be 10,000 to 180,000, preferably 40,000 to 80,000. For example, the weight average molecular weight of the alkali-soluble polymer can be 10,000, 15,000, 20,000, 25,000, 30,000, 35,000, 40,000, 45,000, 50,000, 55,000, 60,000, 65,000, 70,000, 75,000, 80,000, 85,000, 90,000, 95,000, 100,000, 105,000, 110,000, 115,000, 120,000, 125,000, 130,000, 135,000, 140,000, 145,000, 150,000, 155,000, 160,000, 165,000, 170,000, 175,000, or 180,000, or within a range between any two of the values described herein.

In the photosensitive resin film of the present application, the amount of the alkali-soluble polymer based on the total weight of the photosensitive resin film can range from 20 wt % to 85 wt %, more specifically from 40 wt % to 80 wt %, even more specifically from 50 wt % to 75 wt %. For example, the amount of the alkali-soluble polymer based on the total weight of the photosensitive resin film can be 20 wt %, 22.5 wt %, 25 wt %, 27.5 wt %, 30 wt %, 32.5 wt %, 35 wt %, 37.5 wt %, 40 wt %, 42.5 wt %, 45 wt %, 47.5 wt %, 50 wt %, 52.5 wt %, 55 wt %, 57.5 wt %, 60 wt %, 62.5 wt %, 65 wt %, 67.5 wt %, 70 wt %, 72.5 wt %, 75 wt %, 77.5 wt %, 80 wt %, 82.5 wt %, or 85 wt %, or within a range between any two of the values described herein.

1.2.2. (B) Component of Ethylenically Unsaturated Compound(s)

The ethylenically unsaturated compound refers to a compound with at least one reactive ethylene functional group and is preferably a bifunctional compound with two reactive ethylene functional groups. In some embodiments of the present application, the component of ethylenically unsaturated compounds comprises a monofunctional or multifunctional acrylate-based compound and preferably comprises a bifunctional acrylate-based compound. Examples of acrylate-based compound include, but are not limited to, ethoxylated bisphenol-A dimethacrylate, trimethylolpropane triacrylate, ethoxylated trimethylolpropane triacrylate, ethoxylated bisphenol-A diacrylate, tripropylene glycol diacrylate, 1,6-hexanediol diacrylate, polypropylene glycol diacrylate, tris((meth)acryloxyisocyanate) hexamethylene isocyanurate, ethoxylated urethane di(meth)acrylate, propoxylated urethane di(meth)acrylate, ethoxylated/propoxylated urethane di(meth)acrylate, ethoxylated tris (methacryloxyisocyanate) hexamethylene isocyanurate, acrylated tris(methacryloxyisocyanate) hexamethylene isocyanurate, and ethoxylated/propoxylated tris(methacryloxyisocyanate) hexamethylene isocyanurate. Furthermore, based on the weight of the component of ethylenically unsaturated compound(s), the amount of the bifunctional acrylate-based compounds is 60 wt % or more. For example, based on the weight of the component of ethylenically unsaturated compound(s), the amount of the bifunctional acrylate-based compounds can be 60 wt %, 62.5 wt %, 65 wt %, 67.5 wt %, 70 wt %, 72.5 wt %, 75 wt %, 77.5 wt %, 80 wt %, 82.5 wt %, 85 wt %, 87.5 wt %, 90 wt %, 92.5 wt %, 95 wt %, 97.5 wt %, or 100 wt %, or within a range between any two of the values described herein.

In some embodiments of the present application, the component of ethylenically unsaturated compound(s) comprises at least one of ethoxylated bisphenol-A dimethacrylate and trimethylolpropane triacrylate.

In the photosensitive resin film of the present application, the amount of the component of ethylenically unsaturated compound(s) based on the total weight of the photosensitive resin film can range from 5 wt % to 70 wt %, more specifically from 15 wt % to 50 wt %, even more specifically from 20 wt % to 45 wt %. For example, the amount of the component of ethylenically unsaturated compound(s) based on the total weight of the photosensitive resin film can be 5 wt %, 7.5 wt %, 10 wt %, 12.5 wt %, 15 wt %, 17.5 wt %, 20 wt %, 22.5 wt %, 25 wt %, 27.5 wt %, 30 wt %, 32.5 wt %, 35 wt %, 37.5 wt %, 40 wt %, 42.5 wt %, 45 wt %, 47.5 wt %, 50 wt %, 52.5 wt %, 55 wt %, 57.5 wt %, 60 wt %, 62.5 wt %, 65 wt %, 67.5 wt %, or 70 wt %, or within a range between any two of the values described herein.

1.2.3. (C) Photopolymerization Initiator

The photopolymerization initiator refers to a substance that can initiate polymerization reaction in the presence of light. The species of the photopolymerization initiator are not particularly limited. Examples of the photopolymerization initiator include, but are not limited to, imidazole-based compounds, ketone-based compounds, quinone-based compounds, benzoin-based or benzoin ether-based compounds, polyhalogenated compounds, triazine-based compounds, organic peroxide compounds, onium compounds, and other common photopolymerization initiators known in the art.

The aforementioned photopolymerization initiators can be used alone or in combination.

Examples of the imidazole-based compounds include, but are not limited to, 2,4,6-triaryl imidazole dimer, such as 2-(o-chlorophenyl)-4,5-diphenylimidazole dimer, 2-(o-chlorophenyl)-4,5-di(m-methoxyphenyl) imidazole dimer, 2-(o-fluorophenyl)-4,5-diphenylimidazole dimer, 2-(o-methoxyphenyl)-4,5-diphenyl-4,5-triarylimidazole dimer, and 2-(p-methoxyphenyl)-4,5-diphenylimidazole dimer.

Examples of the ketone-based compounds include, but are not limited to, benzophenone, 4,4-bis(dimethylamino) benzophenone, 4-methoxy-4'-dimethylamino benzophenone, 4,4'-dimethoxy benzophenone, 4-dimethylamino benzophenone, 4-dimethylamino acetophenone, xanthone, thioxanthone, 2-chloro thioxanthone, 2,4-diethyl thioxanthone, acridone, α-hydroxy acetophenone, α-amino acetophenone, α-hydroxycycloalkyl phenone, and dialkyl acetophenone.

Examples of quinone-based compounds include, but are not limited to, camphorquinone, benzanthraquinone, 2-tert-butylanthraquinone, and 2-methylanthraquinone.

Examples of benzoin-based or benzoin ether-based compounds include, but are not limited to, benzoin methyl ether, benzoin ethyl ether, benzoin propyl ether, and benzoin phenyl ether.

Examples of polyhalogenated compounds include, but are not limited to, carbon tetrabromide, phenyl tribromomethyl sulfone, and phenyl trichloromethyl ketone.

Examples of triazine-based compounds include, but are not limited to, 2,4,6-tris(trichloromethyl)-s-triazine, 2-methoxy-4,6-bis(trichloromethyl)-s-triazine, 2-amino-4, 6-bis(trichloromethyl)-s-triazine, and 2-(p-methoxystyryl)-4,6-bis(trichloromethyl)-s-triazine.

Examples of organic peroxide compounds include, but are not limited to, methyl ethyl ketone peroxide, cyclohexanone peroxide, 3,3,5-trimethyl cyclohexanone peroxide, benzoyl peroxide, di-tert-butyl isophthalate peroxide, 2,5-dimethyl-2,5-di(benzoylperoxy)hexane, tert-butyl peroxybenzoate, a,a'-bis(tert-butylperoxyisopropyl)benzene, dicumyl peroxide, and 3,3',4,4'-tetra(tert-butylperoxycarbonyl)benzophenone.

Examples of the onium compounds include, but are not limited to, diaryliodonium salts and triarylsulfonium salts obtained from diphenyliodonium, 4,4'-dichlorodiphenyliodonium, 4,4'-dimethoxydiphenyliodonium, 4,4'-di-tert-butyldiphenyliodonium, 4-methyl-4'-isopropyldiphenyliodonium, or 3,3'-dinitrodiphenyl iodonium in combination with chloride, bromide, tetrafluoroborate, hexafluorophosphate, hexafluoroarsenate, hexafluoroantimonate, tetrakis (pentafluorophenyl)borate, or trifluoromethanesulfonic acid.

Examples of the aforementioned other common photopolymerization initiators known in the art include, but are not limited to, fluorine, bisacylphosphine oxides, azinium compounds, organic boron compounds, phenylglyoxylate, and titanocene.

In some embodiments of the present application, the photopolymerization initiator is an imidazole-based compound or a ketone-based compound.

In the photosensitive resin film of the present application, the amount of the photopolymerization initiator based on the total weight of the photosensitive resin film can range from 0.1 wt % to 15 wt %, more specifically from 0.5 wt % to 10 wt %, even more specifically from 1 wt % to 5 wt %. For example, the amount of the photopolymerization initiator based on the total weight of the photosensitive resin film can be 0.1 wt %, 0.5 wt %, 1 wt %, 1.5 wt %, 2 wt %, 2.5 wt %, 3 wt %, 3.5 wt %, 4 wt %, 4.5 wt %, 5 wt %, 5.5 wt %, 6 wt %, 6.5 wt %, 7 wt %, 7.5 wt %, 8 wt %, 8.5 wt %, 9 wt %, 9.5 wt %, 10 wt %, 10.5 wt %, 11 wt %, 11.5 wt %, 12 wt %, 12.5 wt %, 13 wt %, 13.5 wt %, 14 wt %, 14.5 wt %, or 15 wt %, or within a range between any two of the values described herein.

1.2.4. Solvent

In the present application, the photosensitive resin film can further comprise a solvent. The solvent is an inert solvent that can dissolve or disperse the components of the photosensitive resin film but does not react with those components.

In some embodiments of the present application, the photosensitive resin film comprises a solvent with a boiling point ranging from 55° C. to 120° C., preferably from 60° C. to 90° C. For example, the boiling point of the solvent can be 55° C., 60° C., 65° C., 70° C., 75° C., 80° C., 85° C., 90° C., 100° C., 110° C., or 120° C., or within a range between any two of the values described herein. Examples of the solvent having a boiling point ranging from 55° C. to 120° C. include, but are not limited to, methyl acetate, ethyl acetate, acetone, methyl ethyl ketone, propylene glycol methyl ether, methanol, ethanol, n-propanol, and isopropanol. The aforementioned solvents can be used alone or in combination.

In the photosensitive resin film of the present application, the amount of the solvent based on the total weight of the photosensitive resin film can range from 0.1 wt % to 8 wt %, more specifically from 0.1 wt % to 7 wt %. For example, the amount of the solvent based on the total weight of the photosensitive resin film can be 0.1 wt %, 0.5 wt %, 1 wt %, 1.5 wt %, 2 wt %, 2.5 wt %, 3 wt %, 3.5 wt %, 4 wt %, 4.5 wt %, 5 wt %, 5.5 wt %, 6 wt %, 6.5 wt %, 7 wt %, 7.5 wt %, or 8 wt %, or within a range between any two of the values described herein.

1.2.5. Optional Components

With the premise that the absolute value of the first derivative of the weight percentage with respect to time within the range of 0 to 40 min is higher than 0.1%/min and not higher than 1.0%/min when the photosensitive resin film is subjected to the thermogravimetric analysis under the aforementioned conditions, the photosensitive resin film can further comprise additives to improve the properties of the photoresist film. Examples of the additives include, but are not limited to, light absorbers, dyes, pigments, radical inhibitors, and surfactants. The aforementioned additives can be used alone or in combination.

1.3. Preparation of the Photosensitive Resin Film

The preparation of the photosensitive resin film of the present application is not particularly limited. Persons having ordinary skill in the art would be able to prepare the photosensitive resin film by referring to the specification of the subject application, especially relying on the specific illustrations in the Examples. For example, when preparing the photosensitive resin film with the aforementioned exemplary components, the process involves: uniformly mixing the components of the photosensitive resin film, including (A) an alkali-soluble polymer, (B) a component of ethylenically unsaturated compound(s), (C) a photopolymerization initiator, and optional additives, using a stirrer; dissolving or dispersing them in a solvent to form a resin composition; coating the resin composition onto a substrate; and then drying the coated resin composition to obtain a photosensitive resin film.

The coating method of the resin composition in the present application is not particularly limited and can be any existing coating method in the field. Examples of the existing coating methods include, but are not limited to, gravure coating, reverse roll coating, die coating, air scraper coating, scraper coating, rod coating, scraper rod coating, curtain coating, knife coating, transfer roll coating, extrusion press coating, dip coating, kiss coating, spray coating, calendar coating, and extrusion coating. In some embodiments of the present application, the coating method of the resin composition is preferably scraper coating, rod coating, scraper rod coating, or die coating.

The drying temperature can be adjusted depending on the constitution of the photosensitive resin film. Generally, the drying temperature can range from 55° C. to 120° C. For example, the drying temperature can be 60° C., 70° C., 80° C., 90° C., 100° C., 110° C., or 120° C., or within a range between any two of the values described herein. The drying duration can be adjusted depending on the constitution of the photosensitive resin film. In general, the drying duration can be 20 minutes to 60 minutes. For example, the drying duration can be 20 minutes, 25 minutes, 30 minutes, 35 minutes, 40 minutes, 45 minutes, or 50 minutes, or within a range between any two of the values described herein.

2. Application of Photosensitive Resin Film

The photosensitive resin film of the present application can be used as a photoresist film and finds applications in various electronic fields. Generally, before using the photosensitive resin film, protective films that provide protection and support functions can be applied to both surfaces of the photosensitive resin film. This facilitates the storage of the photosensitive resin film and protects it from contamination or damage. Therefore, the present application also provides a composite film, which comprises the aforementioned photosensitive resin film and a protective film on at least one surface of the photosensitive resin film. In a preferred embodiment of the present application, protective films are provided on both surfaces of the photosensitive resin film, and the materials of the protective films on the two different surfaces of the photosensitive resin film can be identical or different.

The type of protective film is not particularly limited and can be any conventional film known in the art. For example, the protective film can be selected from the group consisting of a polyethylene terephthalate film (PET film), a polyolefin film and composites thereof. Examples of polyolefin film include, but are not limited to, a polyethylene film (PE film) and a polypropylene film (PP film), such as an oriented polypropylene film. The composite can be a composite of a polyethylene terephthalate film and a polyolefin film or a composite of different polyolefin films. In a preferred embodiment of the present application, the composite film comprises a PET film on one surface of the photosensitive resin film and a PE film on the other surface of the photosensitive resin film.

The preparation method of the composite film of the present application is not particularly limited and can be any method known in the art. Persons having ordinary skill in the art would be able to prepare the composite film by referring to the specification of the subject application. For example, the composite film can be prepared by stacking the protective films on both surfaces of the photosensitive resin film to provide a laminate and pressing the laminate to obtain the composite film. Alternatively, the composite film can be prepared by coating a resin composition for forming a photosensitive resin film onto a first protective film, drying the coated resin composition to form a photosensitive resin film on the first protective film, and then adhering a second protective film to the surface of the photosensitive resin film which is not in contact with the first protective film. Alternatively, the composite film can be prepared by extruding a resin composition for forming a photosensitive resin film into the gap between two protective films spaced at a determined distance and then drying the extruded resin composition to form a photosensitive resin film between the two protective films.

3. Examples 3.1. Testing Methods

[Thermogravimetric Analysis of the Photosensitive Resin Film]

The PE protective film and the PET protective film of the prepared composite film are removed from both surfaces of the photosensitive resin film. Subsequently, two cuts each along the transverse direction (TD) and machine direction (MD) are made to provide a 20-mg photosensitive resin film as a sample. The furnace of the thermogravimetric analyzer (model number: TA TGA Q500, available from TA instruments) is heated at a rate of 5° C./min from room temperature to 40° C., and the temperature is maintained at 40° C. The sample is placed in the furnace of the thermogravimetric analyzer, using air at a flow rate of 40 mL/min as a purge gas for the balance and air at a flow rate of 100 mL/min as a purge gas for the sample. Subsequently, the sample is heated at a rate of 5° C./min from 40° C. to 200° C. and then the temperature is held at 200° C. for 10 min. During this process, the weight loss is recorded every 0.5 seconds, and the analysis software of Universal Analysis V4.5A Build 4.5.0.5 is used to plot a thermogravimetric curve of the weight percentage with respect to time within the range of 0 to 40 minutes, calculated from the beginning of heating at a rate of 5° C./min. The analysis software is then used to calculate the first derivative from the thermogravimetric curve, yielding a derivative thermogravimetric curve. The first derivative of the weight percentage with respect to time is obtained from the derivative thermogravimetric curve. The weight loss percentage of the photosensitive resin film within the range of 0 to 20 min, the weight loss percentage of the photosensitive resin film within the range of 0 to 10 min, $T_{d5}$, and $T_{d10}$ are obtained from the thermogravimetric curve.

[Wrinkle Test of the Photosensitive Resin Film]

The prepared composite film is wound into a slit roll with a length of 30 m and a width of 300 mm and is placed under a temperature of 23° C. to 27° C. for 12 hours. Subsequently, a composite film of a length of 5 m is pulled out from the slit roll, and the PE protective film of the composite film is peeled off. The surface of the photosensitive resin film is then visually inspected, and the number of wrinkles with a length of 10 mm or more and a width of 1 mm or more located within a range from 3 m to 5 m of the photosensitive resin film is recorded. If no wrinkle with a length of 10 mm or more and a width of 1 mm or more is found, it indicates that the photosensitive resin film has excellent storage properties and operability.

[100-Grid Adhesion Test of the Photosensitive Resin Film]

The 100-grid adhesion test of the photosensitive resin film is conducted according to ASTM D3359 in the following manner. A copper clad laminate with a thickness of 1.6 mm (available form Chang Chun Plastics Co., Ltd.; model: CCP-308) is prepared, wherein the copper foil of the copper clad laminate has a thickness of 35 μm. The copper clad laminate is subjected to brush grinding using a #320 non-woven brush wheel and a #600 non-woven brush wheel, and the temperature of the surface of the copper foil of the copper clad laminate is adjusted to 50° C. The PE protective film on the surface of the prepared composite film is peeled off, and then the photosensitive resin film along with the PET protective film is stacked on the surface of the copper foil in a manner whereby the photosensitive resin film faces the surface of the copper foil of the copper clad laminate, and is then laminated with a laminator to provide a sample. The lamination temperature is 80° C., the lamination pressure is 3.0 kg/cm², and the lamination rate is 2.0 m/min. The PET film on the sample is peeled off, and the photosensitive resin film of the sample is cut into 100 grids of 10×10 squares with a spacing of 1 mm to 1.2 mm via a blade. A transparent tape produced by the 3M company (model: 3M Transparent 600) is then adhered to the surface of the photosensitive resin film at the grids. Then, the tape is peeled off quickly with an angle of 45 degree with respect to the substrate. The number of grids where the photosensitive resin film is peeled off relative to the total grids is calculated and recorded in percentage. A lower percentage of grids where the photosensitive resin film is peeled off means better adhesion of the photosensitive resin film to the copper clad laminate.

3.2. Preparation and Testing of Photosensitive Resin Film 3.2.1. Synthesis of Alkali-Soluble Polymer According to Synthesis Examples 1-5 below, carboxyl-containing acrylic acid-based polymers were prepared as the alkali-soluble polymers.

Synthesis Example 1

For the co-polymerization monomers, 15 g of methacrylic acid, 60 g of methyl methacrylate, and 25 g of butyl acrylate were mixed with 0.5 g of azobisisoheptylnitrile to prepare a solution a1. Separately, 0.5 g of azobisisoheptylnitrile was dissolved in 20 g of ethyl acetate solvent to prepare a solution b1.

A flask equipped with a stirrer, a reflux cooler, a thermometer, and a pipette was prepared. Then, 80 g of ethyl acetate solvent was added into the flask and heated to 70° C. Subsequently, solution a1 was added dropwise into the flask at a constant rate within 3 hours, and the solution in the flask was maintained at a temperature of 70° C. and stirred for 2 hours. While continuously maintaining the temperature of the solution in the flask at 70° C., solution b1 was added dropwise into the flask at a constant rate within 0.5 hours, and the solution in the flask was maintained at a temperature of 70° C. and stirred for 5 hours. Afterwards, the solution in the flask was heated to 90° C. and stirred for 5 hours to complete the reaction. After the reaction was completed, the resultant was cooled to room temperature to obtain a carboxyl-containing acrylic acid-based polymer A (also referred to as "polymer A" hereinafter), which has a weight average molecular weight of 55,000 and a solid content of 50 wt %.

Synthesis Example 2

For the co-polymerization monomers, 15 g of methacrylic acid, 65 g of methyl methacrylate, and 20 g of butyl acrylate were mixed with 0.5 g of azobisisoheptylnitrile to prepare a solution a2. Separately, 0.5 g of azobisisoheptylnitrile was dissolved in 20 g of methyl acetate solvent to prepare a solution b2.

A flask equipped with a stirrer, a reflux cooler, a thermometer, and a pipette was prepared. Then, 102.2 g of methyl acetate solvent was added into the flask and heated to 70° C. Subsequently, solution a2 was added dropwise into the flask at a constant rate within 3 hours, and the solution in the flask was maintained at a temperature of 70° C. and stirred for 2 hours. While continuously maintaining the temperature of the solution in the flask at 70° C., solution b2 was added dropwise into the flask at a constant rate within 0.5 hours, and the solution in the flask was maintained at a temperature of 70° C. and stirred for 5 hours. Afterwards, the solution in the flask was heated to 90° C. and stirred for 5 hours to complete the reaction. After the reaction was completed, the resultant was cooled to room temperature to obtain a carboxyl-containing acrylic acid-based polymer B (also referred to as "polymer B" hereinafter), which has a weight average molecular weight of 65,000 and a solid content of 45 wt %.

Synthesis Example 3

For the co-polymerization monomers, 20 g of methacrylic acid, 40 g of methyl methacrylate, and 40 g of 2-ethylhexyl acrylate were mixed with 0.5 g of azobisisoheptylnitrile to prepare a solution a3. Separately, 0.5 g of azobisisoheptylnitrile was dissolved in 20 g of acetone solvent to prepare a solution b3.

A flask equipped with a stirrer, a reflux cooler, a thermometer, and a pipette was prepared. Then, 80 g of acetone solvent was added into the flask and heated to 70° C. Subsequently, solution a3 was added dropwise into the flask at a constant rate within 3 hours, and the solution in the flask was maintained at a temperature of 70° C. and stirred for 2 hours. While continuously maintaining the temperature of the solution in the flask at 70° C., solution b3 was added dropwise into the flask at a constant rate within 0.5 hours, and the solution in the flask was maintained at a temperature of 70° C. and stirred for 5 hours. Afterwards, the solution in the flask was heated to 90° C. and stirred for 5 hours to complete the reaction. After the reaction was completed, the resultant was cooled to room temperature to obtain a carboxyl-containing acrylic acid-based polymer C (also referred to as "polymer C" hereinafter), which has a weight average molecular weight of 55,000 and a solid content of 50 wt %.

Synthesis Example 4

For the co-polymerization monomers, 20 g of methacrylic acid, 60 g of methyl methacrylate, and 20 g of butyl acrylate were mixed with 0.5 g of azobisisoheptylnitrile to prepare a solution a4. Separately, 0.5 g of azobisisoheptylnitrile was dissolved in 20 g of propylene glycol methyl ether (PGME) solvent to prepare a solution b4.

A flask equipped with a stirrer, a reflux cooler, a thermometer, and a pipette was prepared. Then, 80 g of propylene glycol methyl ether solvent was added into the flask and heated to 70° C. Subsequently, solution a4 was added dropwise into the flask at a constant rate within 3 hours, and the solution in the flask was maintained at a temperature of 70° C. and stirred for 2 hours. While continuously maintaining the temperature of the solution in the flask at 70° C., solution b4 was added dropwise into the flask at a constant rate within 0.5 hours, and the solution in the flask was maintained at a temperature of 70° C. and stirred for 5 hours. Afterwards, the solution in the flask was heated to 90° C. and stirred for 5 hours to complete the reaction. After the reaction was completed, the resultant was cooled to room temperature to obtain a carboxyl-containing acrylic acid-based polymer D (also referred to as "polymer D" hereinafter), which has a weight average molecular weight of 50,000 and a solid content of 50 wt %.

Synthesis Example 5

For the co-polymerization monomers, 15 g of acrylic acid, 65 g of methyl methacrylate, and 20 g of butyl acrylate were mixed with 0.5 g of azobisisoheptylnitrile to prepare a solution a5. Separately, 0.5 g of azobisisoheptylnitrile was dissolved in 20 g of ethyl acetate solvent to prepare a solution b5.

A flask equipped with a stirrer, a reflux cooler, a thermometer, and a pipette was prepared. Then, a mixed solvent of 20 g of ethanol and 60 g of ethyl acetate was added into the flask and heated to 70° C. Subsequently, solution a5 was added dropwise into the flask at a constant rate within 3 hours, and the solution in the flask was maintained at a temperature of 70° C. and stirred for 2 hours. While continuously maintaining the temperature of the solution in the flask at 70° C., solution b5 was added dropwise into the flask at a constant rate within 0.5 hours, and the solution in the flask was maintained at a temperature of 70° C. and stirred for 5 hours. Afterwards, the solution in the flask was heated to 90° C. and stirred for 5 hours to complete the reaction. After the reaction was completed, the resultant was cooled to room temperature to obtain a carboxyl-containing acrylic acid-based polymer E (also referred to as "polymer E" hereinafter), which has a weight average molecular weight of 70,000 and a solid content of 50 wt %.

3.2.2. Preparation of Photosensitive Resin Film

The information about the raw materials used in the following examples and comparative examples is shown in Table 1 below.

TABLE 1

| Raw materials | Description |
| --- | --- |
| Polymer A | Alkali-soluble polymer, the carboxyl-containing acrylic acid-based polymer A prepared in Synthesis Example 1 |

16

TABLE 1-continued

| Raw materials | Description |
| --- | --- |
| Polymer B | Alkali-soluble polymer, the carboxyl-containing acrylic acid-based polymer B prepared in Synthesis Example 2 |
| Polymer C | Alkali-soluble polymer, the carboxyl-containing acrylic acid-based polymer C prepared in Synthesis Example 3 |
| Polymer D | Alkali-soluble polymer, the carboxyl-containing acrylic acid-based polymer D prepared in Synthesis Example 4 |
| Polymer E | Alkali-soluble polymer, the carboxyl-containing acrylic acid-based polymer E prepared in Synthesis Example 5 |
| Bis-A 10EO DMA | Component of ethylenically unsaturated compound, ethoxylated bisphenol-A dimethacrylate, CAS number: 41637-38-1 |
| TMPTA | Component of ethylenically unsaturated compound, trimethylolpropane triacrylate, CAS number: 15625-89-5 |
| HABI; BCIM | Photopolymerization initiator, imidazole-based compound, CAS number: 7189-82-4 |
| EABF | Photopolymerization initiator, ketone-based compound, CAS number: 90-93-7 |
| LCV | Additive, CAS number: 603-48-5 |
| NPG | Additive, CAS number: 103-01-5 |
| 2-mercaptobenzimidazole | Additive, CAS number: 583-39-1 |
| C.I.42040 | Dye, brilliant green, a bisulfate salt, CAS number: 633-03-4 |
| THF | Solvent, tetrahydrofuran, CAS number: 109-99-9 |

The components were mixed according to the proportions shown in Table 2-1 and Table 2-2 and stirred for 1.5 hours to be evenly mixed, thereby obtaining a resin composition. Then, according to the coating and drying conditions shown in Table 2-1 and Table 2-2, the obtained resin composition was coated onto a PET film serving as a protective film with a Kodaira wire-wound rod, and the coated resin composition was dried in an oven. Afterwards, a PE film serving as a protective film was stacked on the surface of the dried resin composition, thereby obtaining the photosensitive resin film wrapped by protective films (i.e. a composite film) of Examples 1 to 11 (E1 to E11) and Comparative Examples 1 to 7 (CE1 to CE7).

TABLE 2-1

| Unit: parts by weight | E1 | E2 | E3 | E4 | E5 | E6 | E7 | E8 | E9 | E10 | E11 |
| --- | --- | --- | --- | --- | --- | --- | --- | --- | --- | --- | --- |
| Polymer A | 200 | 200 | 200 | 200 | | | | | | | |
| Polymer B | | | | | 222 | 222 | | | | | |
| Polymer C | | | | | | | 200 | 200 | | | |
| Polymer D | | | | | | | | | 200 | | |
| Polymer E | | | | | | | | | | 200 | 200 |
| Bis-A 10EO DMA | 45 | 45 | 45 | 45 | 45 | 45 | 45 | 45 | 40 | 45 | 45 |
| TMPTA | | | | | | | | | 5 | | |
| HABI; BCIM | 3 | 3 | 3 | 3 | 3 | 3 | 3 | 3 | 3 | 3 | 3 |
| EABF | 3 | 3 | 3 | 3 | 3 | 3 | 3 | 3 | 3 | 3 | 3 |
| LCV | | | | | | | | | | | |
| NPG | | | | | | | | | | | |
| 2-mercaptobenzimidazole | | | | | | | | | | | |
| C.I.42040 | 0.01 | 0.01 | 0.01 | 0.01 | 0.01 | 0.01 | 0.01 | 0.01 | 0.01 | 0.01 | 0.01 |
| THF | 10 | 10 | 10 | 10 | 10 | 10 | 10 | 10 | 10 | 10 | 10 |
| Coated thickness (μm) | 120 | 200 | 800 | 1100 | 660 | 1100 | 1200 | 800 | 300 | 700 | 200 |
| Drying temperature (° C.) | 100 | 100 | 75 | 85 | 95 | 90 | 60 | 90 | 95 | 115 | 105 |
| Drying duration (min) | 24 | 28 | 45 | 45 | 30 | 33 | 50 | 33 | 28 | 23 | 25 |
| Thickness after drying (μm) | 60 | 100 | 400 | 550 | 300 | 500 | 600 | 400 | 150 | 350 | 100 |

TABLE 2-2

| Unit: parts by weight | CE1 | CE 2 | CE 3 | CE 4 | CE 5 | CE 6 | CE 7 |
|---|---|---|---|---|---|---|---|
| Polymer A | 200 | | 200 | | | | 200 |
| Polymer B | | 222 | | | | | |
| Polymer C | | | | 200 | 200 | | |
| Polymer D | | | | | | | |
| Polymer E | | | | | | 200 | |
| Bis-A 10EO DMA | 45 | 45 | 45 | 45 | 45 | 45 | |
| TMPTA | | | | | | | 5 |
| HABI; BCIM | 3 | 3 | 3 | 3 | 3 | 3 | 3.2 |
| EABF | 3 | 3 | 3 | 3 | 3 | 3 | 0.03 |
| LCV | | | | | | | 0.1 |
| NPG | | | | | | | 0.01 |
| 2-mercapto-benzimidazole | | | | | | | 0.01 |
| C.I.42040 | 0.01 | 0.01 | 0.01 | 0.01 | 0.01 | 0.01 | 0.01 |
| THF | 10 | 10 | 10 | 10 | 10 | 10 | 10 |
| Coated thickness (μm) | 1600 | 1300 | 800 | 600 | 1000 | 400 | 120 |

TABLE 2-2-continued

| Unit: parts by weight | CE1 | CE 2 | CE 3 | CE 4 | CE 5 | CE 6 | CE 7 |
|---|---|---|---|---|---|---|---|
| Drying temperature (° C.) | 100 | 115 | 95 | 100 | 110 | 100 | 130 |
| Drying duration (min) | 24 | 23 | 20 | 22 | 15 | 15 | 30 |
| Thickness after drying (μm) | 800 | 600 | 400 | 300 | 500 | 200 | 60 |

3.2.3. Testing of Photosensitive Resin Film

The properties of the photosensitive resin film of Examples 1 to 11 and Comparative Examples 1 to 7, including the thermogravimetric analysis regarding the first derivative of the weight percentage with respect to time and weight loss percentage within the range of 0 to 20 min, wrinkle, and 100-grid adhesion property, were tested according to the aforementioned testing methods. The results are tabulated in Table 3-1 and Table 3-2.

TABLE 3-1

| | E1 | E2 | E3 | E4 | E5 | E6 | E7 | E8 | E9 | E10 | E11 |
|---|---|---|---|---|---|---|---|---|---|---|---|
| Maximum absolute value of the first derivative of the weight percentage with respect to time | 0.25 | 0.20 | 0.20 | 0.50 | 0.30 | 0.80 | 1.00 | 0.30 | 0.25 | 0.31 | 0.20 |
| Minimum absolute value of the first derivative of the weight percentage with respect to time | 0.007 | 0.009 | 0.008 | 0.007 | 0.008 | 0.006 | 0.010 | 0.005 | 0.006 | 0.008 | 0.007 |
| Weight loss percentage within the range of 0 to 20 min | 2.5 | 2.3 | 2.3 | 2.9 | 3.6 | 4.1 | 9.5 | 2.2 | 2.5 | 2.4 | 3.0 |
| Number of wrinkles | 0 | 0 | 0 | 0 | 0 | 0 | 0 | 0 | 0 | 0 | 0 |
| 100-grid peeled-off percentage | <5% | <5% | <5% | <5% | <5% | <5% | <5% | <5% | <5% | <5% | <5% |

TABLE 3-2

| | CE1 | CE2 | CE3 | CE4 | CE5 | CE6 | CE7 |
|---|---|---|---|---|---|---|---|
| Maximum absolute value of the first derivative of the weight percentage with respect to time | 5.50 | 3.20 | 1.10 | 1.05 | 5.00 | 2.52 | 0.10 |
| Minimum absolute value of the first derivative of the weight percentage with respect to time | 0.005 | 0.008 | 0.009 | 0.010 | 0.007 | 0.008 | 0.006 |
| Weight loss percentage within the range of 0 to 20 min | 49.5 | 38.3 | 9.2 | 8.5 | 23.9 | 18.5 | 0.5 |

TABLE 3-2-continued

|  | CE1 | CE2 | CE3 | CE4 | CE5 | CE6 | CE7 |
|---|---|---|---|---|---|---|---|
| Number of wrinkles | 12 | 10 | 3 | 3 | 5 | 33 | 0 |
| 100-grid peeling-off percentage | <5% | <5% | <5% | <5% | <5% | <5% | >65% |

As shown in Table 3-1 and Table 3-2, the photosensitive resin films of Examples 1 to 11 of the present application do not contain any winkles, indicating good storage properties and operability. They also exhibit low peeling-off percentages (<5%) in the 100-grid test, indicating good adhesion to copper clad laminate. In contrast, the photosensitive resin films of Comparative Examples 1 to 7 cannot simultaneously achieve good storage properties, operability, and adhesion. Comparative Examples 1 to 6 show that if the absolute value of the first derivative of the weight percentage with respect to time within the range of 0 to 40 min is higher than the specified range of the present application, wrinkles will be generated in the photosensitive resin film, indicating poor storage properties and operability. Comparative Example 7 shows that if the absolute value of the first derivative of the weight percentage with respect to time within the range of 0 to 40 min is lower than the specified range of the present application, the photosensitive resin film will show an extremely high peeling-off percentage (>65%) in the 100-grid test, indicating poor adhesion to copper clad laminate.

Furthermore, Comparative Examples 3, 4 and 7 show that even if the weight loss percentage of the photosensitive resin film within the range of 0 to 20 min is similar to that of the embodiments illustrated by the Examples, the inventive effects of good storage properties, operability, and adhesion cannot be achieved as long as the absolute value of the first derivative of the weight percentage with respect to time within the range of 0 to 40 min is not within the specified range. This manifests that the key technical means of the present application indeed lies in controlling the absolute value of the first derivative of the weight percentage of the photosensitive resin film with respect to time within the range of 0 to 40 min in the thermogravimetric analysis to the specified range.

Moreover, relevant studies of the inventor further show that even if the weight loss percentage of the photosensitive resin film within the range of 0 to 10 min, $T_{d5}$, or $T_{d10}$ is similar to that of the embodiments illustrated by the Examples, the inventive effects of good storage properties, operability, and adhesion cannot be achieved as long as the absolute value of the first derivative of the weight percentage with respect to time within the range of 0 to 40 min is not within the specified range. This equally shows that the key technical means of the present application indeed lies in controlling the absolute value of the first derivative of the weight percentage of the photosensitive resin film with respect to time within the range of 0 to 40 min in the thermogravimetric analysis to the specified range.

The above examples illustrate the principle and efficacy of the present application and show its inventive features. People skilled in this field may proceed with various modifications and replacements based on the disclosures and suggestions of the application as described without departing from the principle thereof. Therefore, the scope of protection of the present application is as defined in the claims as appended.

What is claimed is:

1. A photosensitive resin film, wherein when the photosensitive resin film is subjected to a thermogravimetric analysis under the conditions of heating at a rate of 5° C./min from 40° C. to 200° C. and then keeping the temperature at 200° C. for 10 min, the absolute value of the first derivative of the weight percentage with respect to time within the range of 0 to 40 min is higher than 0.1%/min and not higher than 1.0%/min;

wherein the photosensitive resin film has a thickness of 60 μm to 600 μm; and wherein the photosensitive resin film comprises:

(A) an alkali-soluble polymer;

(B) a component of ethylenically unsaturated compound(s); and (C) a photopolymerization initiator.

2. The photosensitive resin film of claim 1, wherein when the photosensitive resin film is subjected to the thermogravimetric analysis, a weight loss percentage of the photosensitive resin film within the range of 0 to 20 min is higher than 0 wt % and not higher than 10 wt %.

3. The photosensitive resin film of claim 2, wherein the weight loss percentage of the photosensitive resin film within the range of 0 to 20 min ranges from 2 wt % to 10 wt %.

4. The photosensitive resin film of claim 1, which is a dry film.

5. The photosensitive resin film of claim 4, which comprises 0.1 wt % to 8 wt % of a solvent based on the total weight of the photosensitive resin film.

6. The photosensitive resin film of claim 1, which has a Tas of 90° C. or higher.

7. The photosensitive resin film of claim 1, which has a Taio of 140° C. or higher.

8. The photosensitive resin film of claim 1, wherein the component B) of ethylenically unsaturated compound(s) comprises one or more bifunctional acrylate-based compounds.

9. The photosensitive resin film of claim 8, wherein based on the weight of the component (B) of ethylenically unsaturated compound(s), the amount of the bifunctional acrylate-based compounds is 60 wt % or more.

10. The photosensitive resin film of claim 2, wherein the component (B) of ethylenically unsaturated compound(s) comprises one or more bifunctional acrylate-based compounds.

11. The photosensitive resin film of claim 10, wherein based on the weight of the component (B) of ethylenically unsaturated compound(s), the amount of the bifunctional acrylate-based compounds is 60 wt % or more.

12. A composite film, which comprises:

the photosensitive resin film of claim 1; and a protective film on at least one surface of the photosensitive resin film.

13. The composite film of claim 12, wherein the protective film is selected from the group consisting of a polyethylene terephthalate film, a polyolefin film, and a composite thereof.

14. A composite film, which comprises:

the photosensitive resin film of claim 2; and a protective film on at least one surface of the photosensitive resin film.

15. The composite film of claim 14, wherein the protective film is selected from the group consisting of a polyethylene terephthalate film, a polyolefin film, and a composite thereof.

\*　\*　\*　\*　\*